(12) United States Patent
Park (10) Patent No.: US 12,550,557 B2
(45) Date of Patent: Feb. 10, 2026

(54) DISPLAY DEVICE INCLUDING TEST PART FOR TESTING THIN FILM LAYER

(71) Applicant: LG Display Co., Ltd., Seoul (KR)

(72) Inventor: Moon Ho Park, Paju-si (KR)

(73) Assignee: LG Display Co., Ltd (KR)

(*) Notice: Subject to any disclaimer, the term of this patent is extended or adjusted under 35 U.S.C. 154(b) by 639 days.

(21) Appl. No.: 18/049,778

(22) Filed: Oct. 26, 2022

(65) Prior Publication Data

US 2023/0209933 A1 Jun. 29, 2023

(30) Foreign Application Priority Data

Dec. 24, 2021 (KR) .................. 10-2021-0186909

(51) Int. Cl.
*H10K 59/131* (2023.01)

(52) U.S. Cl.
CPC .................. *H10K 59/131* (2023.02)

(58) Field of Classification Search
CPC .. G09G 2330/12; H10K 50/80; H10K 50/844; H10K 50/8426; H10K 59/131; H10K 59/1315; H10K 59/8722; H10K 71/70; H10K 77/111; H10K 2102/311; H10K 2102/341

See application file for complete search history.

(56) References Cited

U.S. PATENT DOCUMENTS

| | | | | |
|---|---|---|---|---|
| 2009/0201043 | A1* | 8/2009 | Kaltalioglu | H01L 23/585 |
| | | | | 324/762.05 |
| 2012/0261663 | A1* | 10/2012 | Tsuji | G02F 1/1309 |
| | | | | 257/E21.531 |
| 2018/0102502 | A1* | 4/2018 | Kim | H10K 59/8731 |
| 2021/0012687 | A1* | 1/2021 | Li | G06F 1/1677 |
| 2022/0271102 | A1* | 8/2022 | Kim | G09G 3/3233 |

* cited by examiner

*Primary Examiner* — Eric A. Ward
(74) *Attorney, Agent, or Firm* — Fish & Richardson P.C.

(57) ABSTRACT

A display device includes a thin film layer test part capable of measuring a film quality of a deposited thin film layer, and the thin film layer test part includes a first wiring part formed at an upper surface of a thin film layer to be tested, pad parts connected to opposite ends of the first wiring part, a second wiring part formed at a lower surface of the thin film layer, and a pad part connected to the second wiring part, thus the display device can check a film quality of the thin film layer, for example, through detection of a resistance difference between the first wiring part and the second wiring part by the thin film layer test part.

11 Claims, 6 Drawing Sheets

DISPLAY DEVICE INCLUDING TEST PART FOR TESTING THIN FILM LAYER

CROSS-REFERENCE TO RELATED APPLICATION

This application claims the priority of Korean Patent Application No. 10-2021-0186909 filed on Dec. 24, 2021, which is hereby incorporated by reference in its entirety.

BACKGROUND

Field of the Disclosure

The present disclosure relates to a display device, and more particularly to a display device including a thin film layer test part capable of testing a layer state when a thin film layer such as an inorganic layer, an organic layer, or the like is deposited on a substrate.

Description of the Background

Recently, importance of a flat display device has been increased in accordance with advances in multimedia. To this end, a flat display device such as a liquid crystal display device, a plasma display device, an organic electroluminescent display device, or the like is commercially available. Such a flat display device is configured to have a stack structure of a plurality of thin films. That is, a pixel circuit part constituting a pixel includes a plurality of thin film transistors, and the thin film transistors are completed through deposition of a plurality of thin films.

In addition, a display device is manufactured by producing a plurality of unit display panels on a single mother substrate, and singulating the plurality of unit display panels through a cutting process. In this case, it is needed to check a condition of thin films stacked on the entirety of the mother substrate during a production process. For example, if an insulating layer is deposited with a difference in thickness among the plurality of unit display panels on the mother substrate, a difference in performance among the plurality of unit display panels may be generated.

SUMMARY

Accordingly, the present disclosure is directed to a display device including a test part for testing a condition of a thin film layer that substantially obviates one or more problems due to limitations and disadvantages described above.

More specifically, the present disclosure is to provide a display device including, in a display panel thereof, a test part capable of testing a condition of a thin film layer deposited on a mother substrate.

Additional advantages and features of the disclosure will be set forth in part in the description which follows and in part will become apparent to those having ordinary skill in the art upon reading of the following description or may be learned from practice of the disclosure. Other advantages of the disclosure may be realized and attained by the structure particularly pointed out in the written description and the claims hereof as well as the appended drawings.

To achieve these and other advantages and in accordance with the purpose of the disclosure, as embodied and broadly described herein, a display device includes a display panel formed on a substrate and including a display area deposited with a plurality of thin film layers, and a non-display area disposed around the display area and also deposited with the plurality of thin film layers, and a thin film layer test part disposed in the non-display area, wherein the thin film layer test part includes a first wiring part disposed on an upper surface of at least one of the plurality of thin film layers, a second wiring part disposed on (or at) a lower surface of the at least one thin film layer, a first pad part connected to a first node where one end of the first wiring part and one end of the second wiring part meet, a second pad part connected to another end of the first wiring part, and a third pad part connected to another end of the second wiring part.

The first pad part, the second pad part, and the third pad part may be disposed on the upper surface of the at least one of the plurality of thin film layers.

Each of the first wiring part and the second wiring part may have a meandering structure.

Each of the first wiring part and the second wiring part may include a plurality of first portions extending in a direction of a tensile stress or a compressive stress applied to the at least one of the plurality of thin film layers, and a plurality of second portions each interconnecting ends of adjacent ones of the plurality of first portions.

Each of the first wiring part and the second wiring part may be varied in resistance in accordance with a tensile force or a compressive force exerted on the at least one of the plurality of thin film layers.

The display device may further include a thin film transistor including a semiconductor pattern formed on the substrate, a gate electrode overlapping with the semiconductor pattern, and a source electrode and a drain electrode disposed on the semiconductor pattern and electrically connected to the semiconductor pattern, and a storage capacitor including a first capacitor electrode, and a second capacitor electrode disposed to overlap with the first capacitor electrode with an interlayer insulating layer interposed therebetween.

The first wiring part may be disposed on the same layer as one of the first capacitor electrode and the second capacitor electrode, and the second wiring part may be disposed on the same layer as the gate electrode.

The first wiring part may be disposed on the same layer as one of the source electrode and the drain electrode, and the second wiring part may be disposed on the same layer as one of the first capacitor electrode and the second capacitor electrode.

The first wiring part may be disposed on the same layer as one of the source electrode and the drain electrode, and the second wiring part may be disposed on the same layer as the gate electrode.

The at least one of the plurality of thin film layer may include an inorganic insulating layer.

Each of the plurality of first portions may be greater in length than each of the plurality of second portions.

The first pad part may be connected to the second wiring part via a first contact hole extending through the at least one thin film layer, and the third pad part may be connected to the second wiring part via a second contact hole extending through the at least one thin film layer.

BRIEF DESCRIPTION OF THE DRAWINGS

The accompanying drawings, which are included to provide a further understanding of the disclosure and are incorporated in and constitute a part of this application, illustrate aspect(s) of the disclosure and along with the description serve to explain the principle of the disclosure.

In the drawings.

DETAILED DESCRIPTION

Advantages and features of the present disclosure, and implementation methods thereof, will be clarified through following aspects described with reference to the accompanying drawings. However, the present disclosure may be embodied in different forms and should not be construed as limited to the aspects set forth herein. Rather, these aspects are provided so that the present disclosure will be thorough and complete, and will fully convey the scope of the disclosure to those skilled in the art. Further, the present disclosure is defined only by the categories of the claims.

A shape, a size, a ratio, an angle, and a number disclosed in the drawings for describing aspects of the present disclosure are merely an example, and thus, the present disclosure is not limited to the illustrated details. The same reference numerals designate substantially the same elements throughout the specification. In the following description, when the detailed description of the relevant known function or configuration is determined to unnecessarily obscure the gist of the present disclosure, the detailed description will be omitted. When "comprise", "have", and "include" described in the specification are used, another part may be added unless "only" is used. Terms in a singular form may include plural forms unless stated otherwise.

In construing an element, the element is construed as including a tolerance range, even if there is no explicit description.

In describing a position relationship between two elements, for example, when the position relationship is described using "upon", "above", "below", and "next to", one or more other elements may be interposed between the two elements unless "just" or "directly" is used.

In describing a temporal relationship, for example, when the temporal order is described as "after", "subsequent", "next", and "before", the case which is not continuous may also be included unless "just" or "directly" is used.

It will be understood that, although the terms "first", "second", etc. may be used herein to describe various elements, these elements should not be limited by these terms. These terms are only used to distinguish one element from another element. For example, a first element referred to in the following description may represent a second element, without departing from the scope of the present disclosure.

The following aspects may be partially or overall coupled or combined, and may be technically linked and implemented in various manners. The aspects may be independently implemented, or may be implemented in a co-dependent relationship.

Hereinafter, exemplary aspects of the present disclosure will be described in detail with reference to the accompanying drawings.

Figure 1:
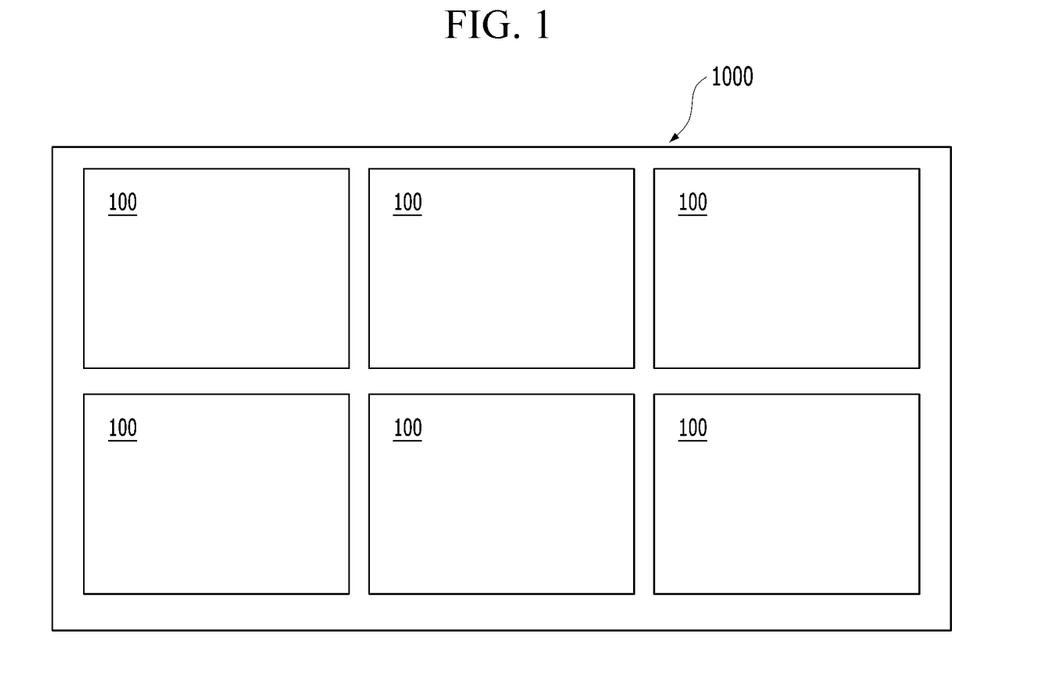
FIG. 1 is a plan view showing a layout of a plurality of unit panels disposed on a mother substrate.

FIG. 1 briefly shows a plan view of a plurality of display panels 100 disposed on a mother substrate 1000. The mother substrate 1000 is the largest possible size of a plastic or glass substrate that a factory can manufacture that will not break under its own weight.

A display device such as a liquid crystal display device, an organic light emitting display device, or the like includes an array substrate on which a plurality of transistors constitute a pixel circuit part. The array substrate is coupled to a cover substrate or the like capable of being configured separately from the array substrate and, as such, constitutes a single complete display panel.

For mass production, a plurality of display panels 100 are simultaneously formed on one mother substrate 1000. Accordingly, a plurality of thin film layers to be deposited on each display panel 100 are simultaneously deposited on the mother substrate 1000. In addition, deposition processes of respective thin film layers are performed in the same deposition equipment. For this reason, when an error is generated in the deposition equipment, the thin film layers may be deposited to have a non-uniform film quality.

Meanwhile, in a manufacturing process of the display panel 100, a series of deposition processes are sequentially and continuously performed. For this reason, even when a failure (or defect) caused by a non-uniform film quality is found through a test process, after completion of the display panel 100, a problem that it may be impossible to find the process causing the found failure (or defect) often occurs.

To this end, in accordance with an aspect of the present disclosure, a thin film layer test part K capable of testing whether or not a thin film layer deposited in each deposition process during the manufacturing of a plurality of display panel 100 on the mother substrate 1000 has uniformity is provided.

At least one thin film layer test part K may be disposed in each display panel 100 formed on the mother substrate 1000.

Figure 2:
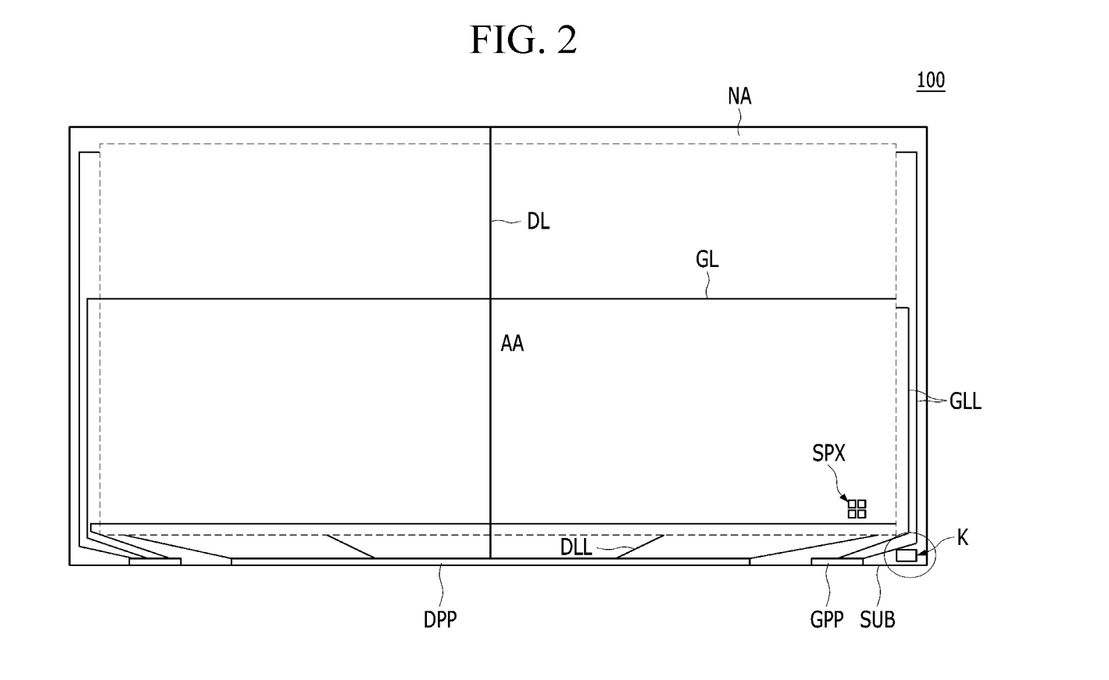
FIG. 2 is a plan view briefly showing one display panel including a thin film layer test part.

FIG. 2 is a plan view showing a schematic structure of one display panel 100 according to an aspect of the present disclosure.

The display panel 100 includes a display area AA in which an image is rendered, and a non-display area NA disposed around the display area AA. Sub-pixels SPX are disposed in the display area AA such that the sub-pixels SPX are arranged in the form of a matrix.

A substrate SUB may be made of a plastic material having flexibility, or glass may be used for the substrate SUB. When glass is used for the substrate SUB, the capability of the substrate SUB withstanding a high temperature during a manufacturing process of the display panel 100 is excellent, flatness may be easily maintained during the manufacturing process, and cost may be low, as compared to the plastic material.

The display area AA is an area in which the sub-pixels SPX are arranged in the form of a matrix. A plurality of thin film transistors are disposed in each sub-pixel SPX. For an active layer of each thin film transistor, patterns of various materials such as a polycrystalline semiconductor pattern, an oxide semiconductor pattern, or the like may be selected.

A plurality of data lines DL and a plurality of gate lines GL may be disposed in the display area AA. For example, the plurality of data lines DL may be arranged in rows or columns, and the plurality of gate lines GL may be arranged in columns or rows. One sub-pixel SPX may be disposed in a region defined by one data line DL and one gate line GL.

A gate pad part GPP, on which a gate driver (not shown) including a gate driving circuit may be mounted, may be disposed in the non-display area NA. The gate driving circuit sequentially drives respective pixel rows of the display area AA by sequentially supplying a scan signal to the plurality of gate lines GL. Here, the gate driving circuit is also referred to as a "scan driving circuit". Here, a pixel row is referred to a row constituted by pixels connected to one gate line GL. The gate driving circuit may be embodied as a gate-in panel (GIP) type and, as such, may be directly disposed on a substrate 301.

A gate driving part (not shown) including the gate driving circuit sequentially supplies a scan signal of an ON voltage or an OFF voltage to the plurality of gate lines GL.

In addition, a data pad part DPP, on which a data driver (not shown) including a data driving circuit may be mounted, may be disposed in the non-display area NA. When a particular gate line is switched-on or opened by the gate driver, the data driving circuit converts image data into a data voltage of an analog type, and supplies the data voltage to the plurality of data lines.

The gate driver and the data driver may be mounted on a flexible printed circuit board (FPCB) in a chip-in film (COF) manner, and the flexible printed circuit board (FPCB) may be mounted on the gate pad part GPP and the data pad part DPP disposed in the non-display area NA.

Meanwhile, a thin film layer test part K capable of testing a film quality of a thin film layer deposited on the substrate SUB may be disposed in the non-display area NA. The thin film layer test part K may be disposed in any region of the non-display area NA.

Figure 3:
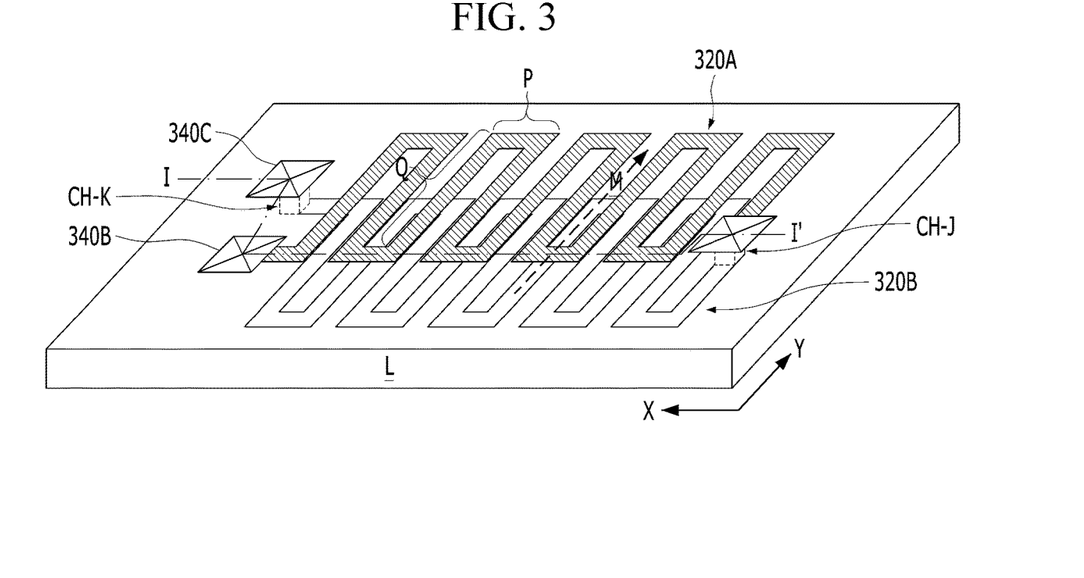
FIG. 3 is a perspective view showing a structure of a thin film layer test part according to an aspect of the present disclosure.
Figure 4:
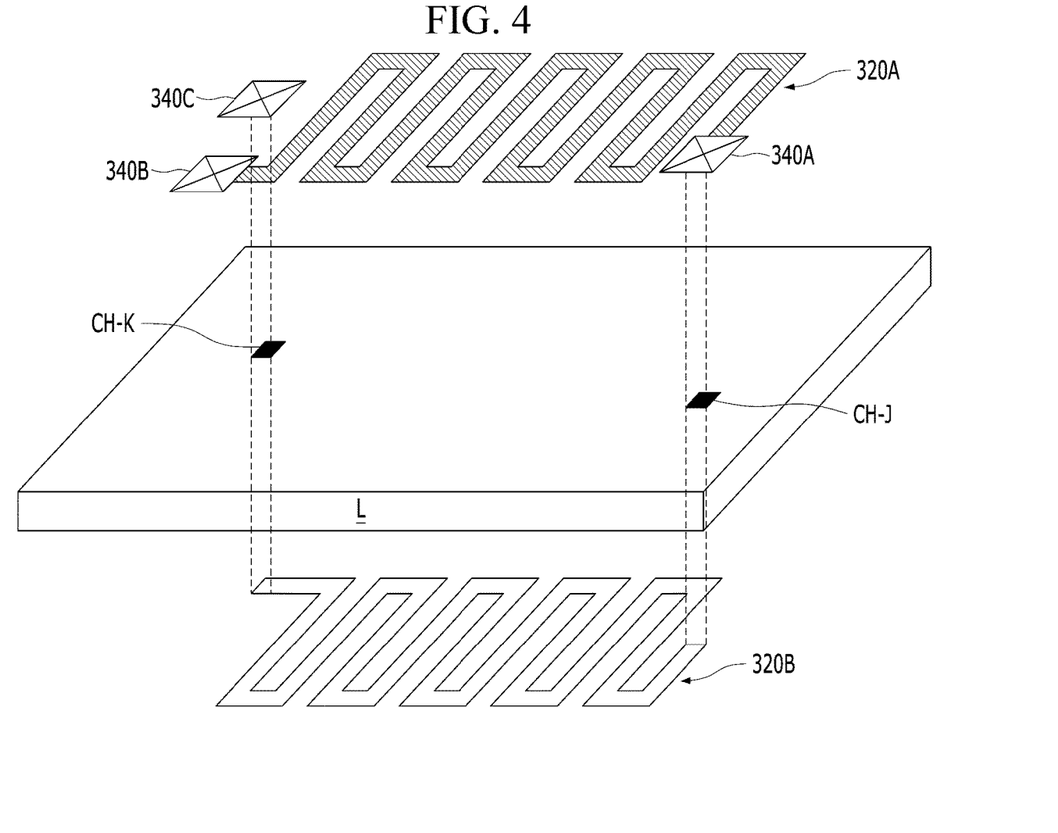
FIG. 4 is an exploded perspective view showing the thin film layer test part according to the aspect of the present disclosure.

FIG. 3 is a perspective view of a thin film layer test part K according to an aspect of the present disclosure. FIG. 4 is an exploded perspective view of the thin film layer test part K.

Referring to FIG. 3, the thin film layer test part K includes a first wiring part 320A installed (or disposed) on an upper surface of a thin film layer L to be tested, and a second wiring part 320B installed on a lower surface of the thin film layer L. The first wiring part 320A and the second wiring part 320B are interconnected at one point. This point will be referred to as a "first node". Referring to FIG. 3, the first node may be a region in which the first wiring part 320A and the second wiring part 320B are interconnected (or meet) via a first contact hole CH-J formed in the thin film layer L, and a first pad part 340A is disposed. That is, the first wiring part 320A and the second wiring part 320B are interconnected via the first contact hole CH-J at the first node. In addition, one end of the first wiring part 320A is connected to the first pad part 340A installed on the upper surface of the thin film layer L at the first node.

The other end of the first wiring part 320A is connected to a second pad part 340B. The second pad part 340B may be disposed on the upper surface of the thin film layer L.

Meanwhile, one end of the second wiring part 320B installed on the lower surface of the thin film layer L is connected to the first pad part 340A via the first contact hole CH-J, and the other end of the second wiring part 302B is connected to a third pad part 340C via a second contact hole CH-K.

Accordingly, all of the first pad part 340A, the second pad part 340B and the third pad part 340C may be disposed on the upper surface of the thin film layer L. Accordingly, after the thin film layer test part K is installed on the thin film layer L, a test probe may easily measure a variation in resistance of the first wiring part 320A under the condition that the test probe contacts the first pad part 340A and the second pad part 340B, and may easily measure a variation in resistance of the second wiring part 320B under the condition that the test probe contacts the first pad part 340A and the third pad part 340C.

Both the first wiring part 320A and the second wiring part 320B may have a zigzag structure or a meandering structure. For example, a structure of the first wiring part 320A will be described with reference to FIGS. 3 to 5B.

The first wiring part 320A and the second wiring part 320B may have the same structure.

The meandering structure may include a plurality of first portions O of the first wiring part 320A aligned in a direction M in which a tensile stress or a compressive stress is applied to the thin film layer L, and a plurality of second portions P each interconnecting ends of adjacent ones of the plurality of first portions O of the first wiring part 320A.

The first portion O of the first wiring part 320A may have a greater length than the second portion P of the first wiring part 320A. For example, the length of the first portion O of the first wiring part 320A may be at least 5 times the length of the second portion P of the first wiring part 320A. Accordingly, the first portion O of the first wiring part 320A may sensitively respond to a tensile stress or a compressive stress applied to the thin film layer L and, as such, may exhibit a fine length variation. As a result, it may be possible to easily measure a variation in resistance of the first wiring part 320A.

Figure 5A:
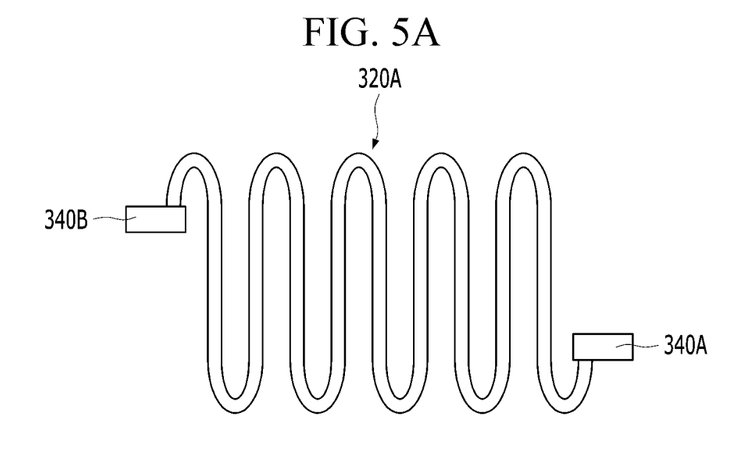
FIGS. 5A and 5B are views showing structures of first and second wiring parts of the thin film layer test part according to various aspects of the present disclosure.
Figure 5B:
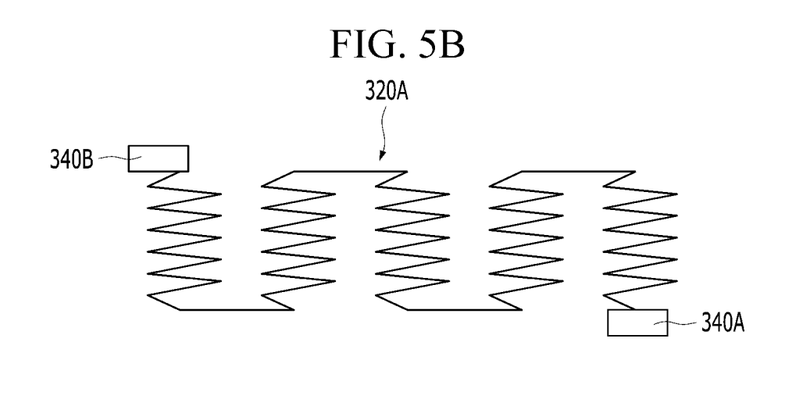

The first wiring part 320A, which has a meandering structure, may have various shapes, as shown in FIGS. 5A and 5B. That is, it is desirable that each first portion O of the first wiring part 320A has a structure sensitively variable in response to a tensile stress or a compressive stress.

In addition, the entirety of the first wiring part 320A may have a meandering structure. Of course, each first portion O of the first wiring part 320A and each second portion P of the first wiring part 320A may have meandering structures, respectively.

As a result, it may be possible to sense a length variation of the first wiring part portion O, irrespective of directions of a tensile stress and a compressive stress applied to the deposited thin film layer L.

A tensile stress and a compressive stress applied to the thin film layer L may be greatly generated when the deposited thin film layer is non-uniform. For example, referring to FIG. 3, when the thin film layer L is non-uniformly deposited and, as such, has a roughness at a surface thereof, the first wiring part 320A deposited on the surface may also has a curvature. As a result, the length of the first wiring part 320A from the first pad part 340A to the second pad part 340B increases and, as such, the resistance of the first wiring part 320A is also increased. Through measurement of such a resistance variation, it may be possible to determine the film quality of the deposited thin film layer L.

The thin film layer L may be a single layer or multiple layers. In addition, the thin film layer L may be an inorganic thin film layer or an organic thin film layer. For example, the thin film layer L may be a gate insulating layer deposited on a semiconductor pattern, an interlayer insulating layer deposited on a gate electrode, and a passivation layer disposed on a source electrode and a drain electrode. All of these layers generally use an inorganic insulating layer. In addition, each insulating layer may be constituted by a single layer, or may be constituted by multiple layers. In this regard, the thin film layer L according to the aspect of the present disclosure may be a single layer or multiple layers.

In addition, the thin film layer L may be an organic layer. For example, the thin film layer L may be a planarization layer dividing a pixel circuit part and a light emitting device part from each other. Generally, the planarization layer is constituted by an organic insulating layer. Accordingly, the thin film layer L may be an organic layer, and may be a single layer or a plurality of layers.

At least one thin film layer test part K may be formed in the non-display area NA of the display panel. In addition, the thin film layer test part K may be disposed in all of unit display panels formed on a mother substrate. Accordingly, it may be possible to determine a film quality of each display panel and to compare film quality states of the unit display panels simultaneously formed on the mother substrate, through data collected by the thin film layer test part K.

Test of a thin film layer through the thin film layer test part K may be performed immediately after deposition of each thin film layer.

Meanwhile, at least one thin film layer test part K may be installed for each thin film layer. For example, it may be possible to install a thin film layer test part configured to test a state of a gate insulating layer and a thin film layer test part configured to test a state of an interlayer insulating layer on these thin film layers, respectively.

The relationship between each thin film layer of a pixel circuit part and a thin film layer test part K in the case in which the thin film layer test part K is installed in an organic light emitting display device in accordance with an aspect of the present disclosure will be described with reference to FIGS. 6A and 6B. Of course, the application of the thin film layer test part K of the present disclosure is not limited to the organic light emitting display device. The thin film layer test part K of the present disclosure is applicable to any display device in which a plurality of thin film layers are deposited on a substrate.

Figure 6A:
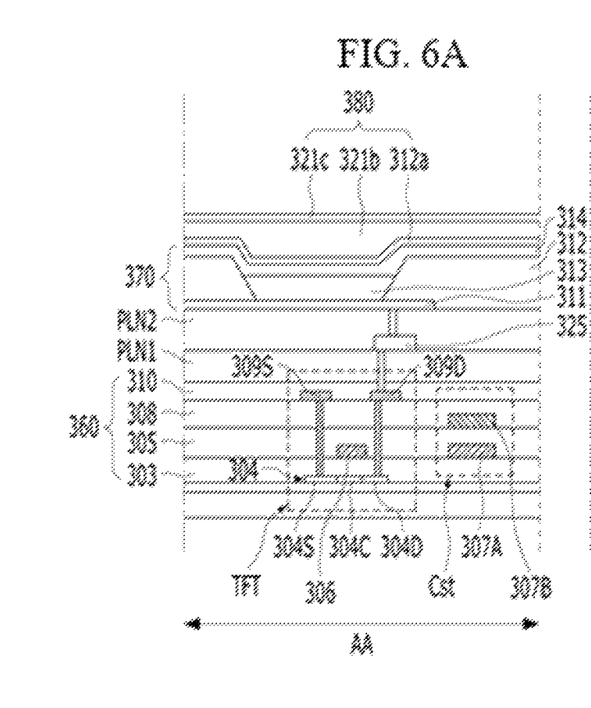
FIG. 6A is a cross-sectional view of a sub-pixel in a display area and FIG. 6B is a cross-sectional view taken along line I-I' in FIG. 3, showing a structure of a thin film layer test part according to an aspect of the present disclosure.
Figure 6B:
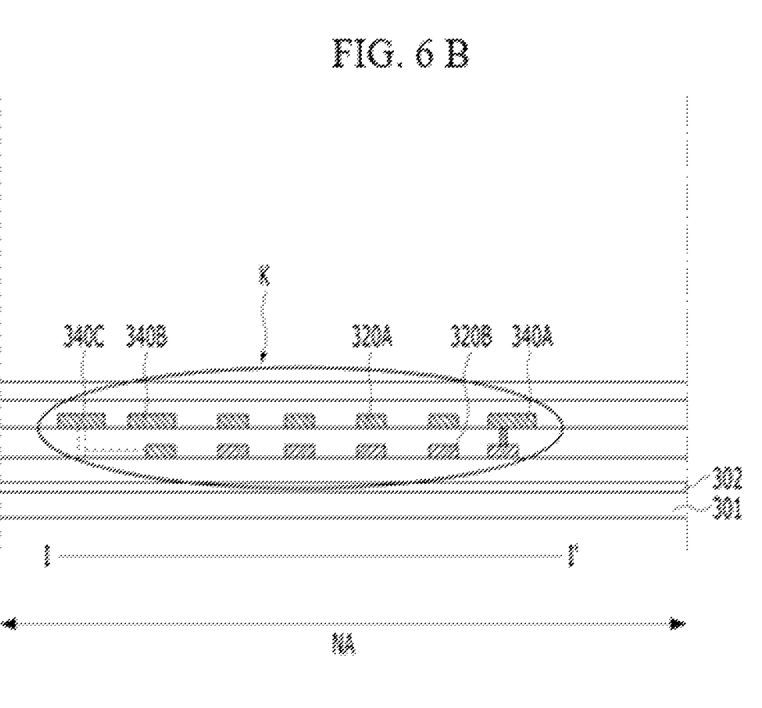

Referring to FIGS. 6A and 6B, a cross-sectional view of a sub-pixel SPX in a display area and a cross-sectional view of a thin film layer test part K in a non-display area taken along line I-I' in FIG. 3 are shown respectively.

Referring to FIGS. 6A and 6B, a display panel 100 includes a display area AA provided on a substrate 301, and a non-display area NA provided on the substrate 301 while being disposed around the display area AA. The substrate 301 may be formed of a plastic material having flexibility such that the substrate 301 is bendable. For example, the substrate 301 may be formed of polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC), or the like. Of course, glass is not excluded from a material of the substrate 301.

A sub-pixel in the display area AA in FIG. 6A includes a thin film transistor using a polycrystalline semiconductor material for an active layer.

At least one of a data driver (not shown) and a gate driver (not shown) may be disposed in the non-display area NA. In addition, the substrate 301 may further include a bending area which is bendable.

Among the drivers, the gate driver may be directly formed on the substrate 301 by use of a thin film transistor using a polycrystalline semiconductor material for an active layer, or may be formed by use of a thin film transistor using a polycrystalline semiconductor material for an active layer and a thin film transistor using an oxide semiconductor material for an active layer.

Since the thin film transistor having the oxide semiconductor layer and the thin film transistor having the polycrystalline semiconductor layer exhibit high electron mobility at channels thereof, respectively, high definition and low-power driving may be realized.

A plurality of data lines and a plurality of gate lines may be disposed in the display area AA. For example, the plurality of data lines may be arranged in rows or columns, and the plurality of gate lines may be arranged in columns or rows. A sub-pixel SPX may be disposed in a region defined by one data line and one gate line.

The gate driver, which includes a gate driving circuit, may be disposed in the non-display area NA. The gate driving circuit of the gate driver sequentially drives respective pixel rows of the display area AA by sequentially supplying a scan signal to the plurality of gate lines. Here, the gate driving circuit is also referred to as a "scan driving circuit". Here, a pixel row is referred to a row constituted by pixels connected to one gate line.

The gate driving circuit may be constituted by a thin film transistor having a polycrystalline semiconductor layer, may be constituted by a thin film transistor having an oxide semiconductor layer, or may be constituted by a pair of thin film transistors constituted by the thin film transistor having the polycrystalline semiconductor layer and the thin film transistor having the oxide semiconductor layer. When the thin film transistors disposed in the non-display area NA and the display area AA use the same semiconductor material, formation thereof may be simultaneously performed using the same process.

The gate driving circuit may include a shift register, a level shifter, etc.

The gate driving circuit may be embodied as a gate-in panel (GIP) type, as in the display device according to the above-described aspect of the present disclosure, and, as such, may be directly disposed on the substrate 301.

A gate driving part including the gate driving circuit sequentially supplies a scan signal of an ON voltage or an OFF voltage to the plurality of gate lines.

In accordance with an aspect of the present disclosure, the display panel 100 may further include a data driving circuit. When a particular gate line is switched-on or opened by the gate driver including the gate driving circuit, the data driving circuit converts image data into a data voltage of an analog type, and supplies the data voltage to the plurality of data lines.

The plurality of gate lines, which are disposed on the substrate 301, may include a plurality of scan lines and a plurality of emission control lines. The plurality of scan lines and the plurality of emission control lines are lines configured to transfer different kinds of gate signals (a scan signal and an emission control signal) to gate nodes of different kinds of transistors (a scan transistor and an emission control transistor), respectively.

The gate driver including the gate driving circuit may include a scan driving circuit configured to output scan signals to one kind of gate lines, that is, a plurality of scan lines, and an emission driving circuit configured to output emission control signals to another kind of gate lines, that is, a plurality of emission control lines.

The data line may be disposed to pass through the bending area (not shown). Various data lines may be disposed such that the data lines are connected to data pads (not shown).

One sub-pixel will be briefly described. The sub-pixel is constituted by a pixel circuit part 360 disposed on the substrate 301, and a light emitting device part 370 electrically connected to the pixel circuit part 360 via a connection electrode 325, and an encapsulation layer part 380. The pixel circuit part 360 and the light emitting device part 370 are separated from each other by planarization layers PLN1 and PLN2.

Here, the pixel circuit part 360 represents an array part including a thin film transistor TFT, which may be one of a driving thin film transistor and a switching thin film transistor, and a storage capacitor Cst, to drive one sub-pixel SPX. In addition, here, the light emitting device part 370 represents an array part including an anode 311, a cathode 314, and an emission layer 313 disposed therebetween, for light emission. Besides, a bank 312 is formed under the cathode 314 and covers a part of the anode 311.

In addition, the encapsulation layer part 380 represents a part in which an inorganic layer 312a, an organic layer 312b and an inorganic layer 312c are stacked in this order, to seal the light emitting device part 370.

The substrate 301 may be constituted by a multilayer structure in which an organic layer and an inorganic layer are alternately stacked. For example, the substrate 301 may be formed as an organic layer of, for example, polyimide and an inorganic layer of, for example, silicon oxide ($SiO_2$) are alternately stacked.

A lower buffer layer 302 is formed on the substrate 301. The lower buffer layer 302 may be used to block moisture or the like penetrating from an exterior thereof, and may be formed by stacking a silicon oxide ($SiO_2$) layer or the like in multiple layers.

A second buffer layer (not shown) may be further formed over the lower buffer layer 302 in order to protect the thin film transistors disposed in the pixel circuit part from penetration of moisture one more time.

The thin film transistor TFT is formed in the display area AA on the substrate 301. The thin film transistor TFT may use a polycrystalline semiconductor pattern as an active layer. The thin film transistor TFT includes a polycrystalline semiconductor pattern 304 including a channel, through which an electron or a hole migrates, a gate electrode 306, a source electrode 309S, and a drain electrode 309D.

The polycrystalline semiconductor pattern 304 is constituted by a polycrystalline semiconductor material, and includes a channel region 304C disposed at a central portion thereof. A source region 304S and a drain region 304D are disposed under the condition that the channel region 304C is interposed therebetween.

Each of the source region 304S and the drain region 304D is a conductive region formed by doping an intrinsic polycrystalline semiconductor pattern with group-V or III impurity ions, for example, phosphorous (P) or boron (B), in a predetermined concentration.

The channel region 304C is a region in which the polycrystalline semiconductor material is maintained in an intrinsic state, and provides a path through which an electron or a hole migrates.

Meanwhile, the thin film transistor TFT includes the gate electrode 306 which overlaps with the channel region 304C of the polycrystalline semiconductor pattern 304. A gate insulating layer 303 is interposed between the gate electrode 306 and the polycrystalline semiconductor pattern 304.

Referring to FIGS. 6A and 6B, in an aspect of the present disclosure, the thin film transistor TFT has a top gate type structure in which the gate electrode 306 is disposed over the polycrystalline semiconductor pattern 304. Accordingly, it may be possible to form a first storage capacitor electrode 307A, which is constituted by a gate electrode material, through a single mask process and, as such, to reduce the number of mask processes.

Meanwhile, a second wiring part 320B of the thin film layer test part K disposed in the non-display area NA may be formed on the same layer as the gate electrode 306 using the same material as the gate electrode 306. Accordingly, the second wiring part 320B may be formed simultaneously with the gate electrode 306 and the first storage capacitor electrode 307A and, as such, the number of mask processes may be reduced.

The gate electrode 306 is constituted by a metal material. For example, the gate electrode 306 may be a single layer or multiple layers made of one or an alloy of molybdenum (Mo), aluminum (Al), chromium (Cr), gold (Au), titanium (Ti), nickel (Ni), neodymium (Nd), and copper (Cu), without being limited thereto.

Although one of electrodes of the storage capacitor Cst has been illustrated as being formed on the same layer as the gate electrode 306, each electrode of the storage capacitor Cst may be formed on a separate layer different from that of the gate electrode 306.

A first interlayer insulating layer 305 is deposited on the gate electrode 306. The first interlayer insulating layer 305 may be constituted by silicon nitride ($SiN_x$). In particular, the first interlayer insulating layer 305, which is constituted by silicon nitride ($SiN_x$), may include hydrogen particles. The hydrogen particles included in the first interlayer insulating layer 305 may penetrate the source region 304S and the drain region 304D when a thermal treatment process is performed after deposition of the first interlayer insulating layer 305, thereby causing the polycrystalline semiconductor material to become conductive. This is referred to as a "hydrogenation process".

A second storage capacitor electrode 307B may be disposed on the first interlayer insulating layer 305. Accordingly, the first storage capacitor electrode 307A and the second storage capacitor electrode 307B constitute the storage capacitor Cst under the condition that the first interlayer insulating layer 305 is interposed therebetween.

Meanwhile, a first wiring part 320A of the thin film layer test part K is disposed in the non-display area NA. In addition, a first pad part 340A, a second pad part 340B and a third pad part 340C, which are connected to respective ends of the first wiring part 320A and the second wiring part 320B, may be further formed.

The first wiring part 320A and the first, second and third pad parts 340A, 340B and 340C may be formed on the same layer as the second storage capacitor electrode 307B, simultaneously with the second storage capacitor electrode 307B. Accordingly, the number of mask processes for formation of the first wiring part 320A may be reduced.

When the thin film layer test part K including the first wiring part 320A and the second wiring part 320B is completed, it may be possible to collect data as to the film quality of the first interlayer insulating layer by connecting a test probe to the first pad part 340A and the second pad part 340B, thereby measuring a resistance of the first wiring part 320A, and connecting the test probe to the first pad part 340A and the third pad part 340C, thereby measuring a resistance of the second wiring part 320B.

Meanwhile, a second interlayer insulating layer 308 may be deposited on the second storage capacitor electrode 307B. The second interlayer insulating layer 308 may include a silicon oxide ($SiO_2$) layer.

Although each of the first interlayer insulating layer 305 and the second interlayer insulating layer 308 has been described as being a single layer, each of the first interlayer insulating layer 305 and the second interlayer insulating layer 308 may be multiple layers, if necessary. Accordingly, the thin film layer test part K may test a film quality of a thin film layer having a multilayer structure after deposition of the thin film layer.

The source electrode 309S and the drain electrode 309D may be formed on the second interlayer insulating layer 308.

Thereafter, a first planarization layer PLN1 and a second planarization layer PLN2 may be formed over the source electrode 309S and the drain electrode 309D, so as to planarize an upper surface of the pixel circuit part 360 and separate the light emitting device part 370 and the pixel circuit part 360 from each other.

The aspect of the present disclosure referring to FIGS. 6A and 6B discloses that the thin film layer test portion K includes the second wiring part 320B and the first wiring part 320A respectively formed simultaneously with the gate electrode 306 and the second storage capacitor electrode 307B and, as such, the number of mask processes is reduced.

Figure 7A:
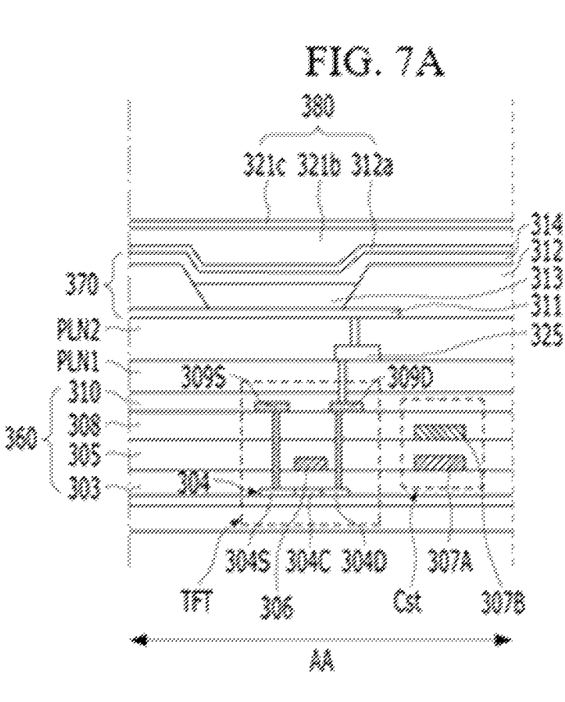
FIG. 7A is a cross-sectional view of a sub-pixel in a display area.
Figure 7B:
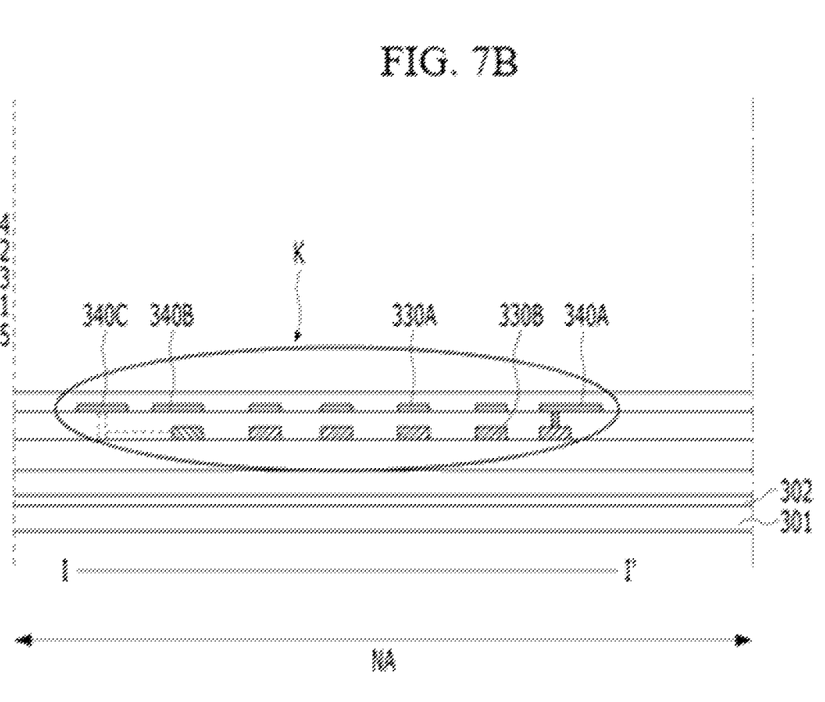
FIG. 7B is a cross-sectional view taken along line I-I' in FIG. 3, showing a structure of a thin film layer test part according to another aspect of the present disclosure.

Meanwhile, another aspect of the present disclosure referring to FIGS. 7A and 7B discloses that a thin film layer test portion K includes a second wiring part 330B and a first wiring part 330A respectively formed simultaneously with a second storage capacitor electrode 307B and a source electrode 309S/a drain electrode 309D.

The aspect of the present disclosure referring to FIGS. 7A and 7B illustrates that the thin film layer test part K may test a film quality of a second interlayer insulating layer 308.

The second interlayer insulating layer 308 is disposed between the source electrode 309S/the drain electrode 309D and the second storage capacitor electrode 307B. In addition, the second interlayer insulating layer 308 is disposed between the first wiring part 330A and the second wiring part 330B. Accordingly, it may be possible to collect information as to deposition of the second interlayer insulating layer 308 throughout the entirety of a mother substrate by collecting measurement data as to a resistance of the first wiring part 330A and a resistance of the second wiring part 330B.

Other configurations of the aspect of FIGS. 7A and 7B are the same as those of the aspect referring to FIGS. 6A and 7B and, as such, no description thereof will be given.

Although the thin film layer test part K has been described with reference to FIGS. 6A, 6B and 7A, 7B as having a structure capable of testing only one layer of the display panel 100, the aspects of FIGS. 6A, 6B and 7A, 7B may be combined with each other and, as such, the thin film layer test part K may be installed for each thin film layer in order to collect information as to each thin film layer.

Figure 8A:
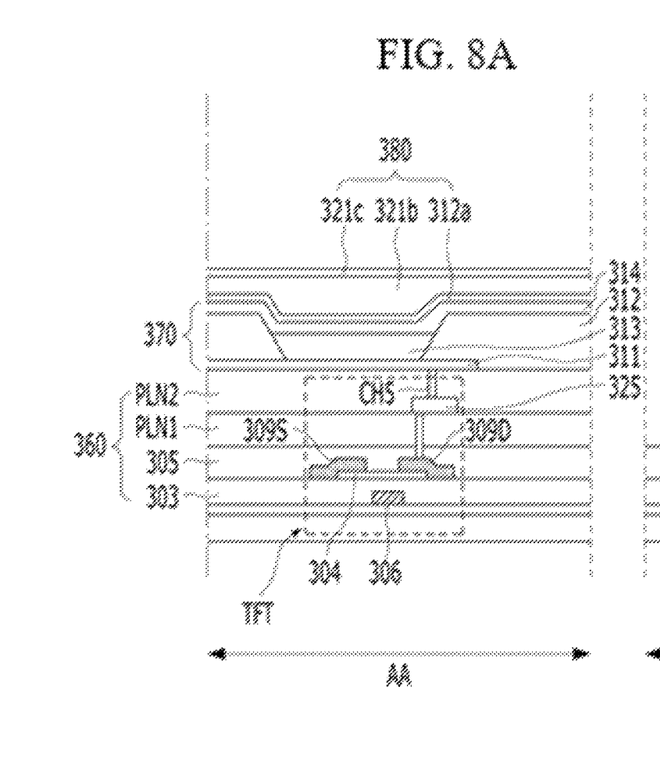
FIG. 8A is a cross-sectional view of a sub-pixel in a display area.
Figure 8B:
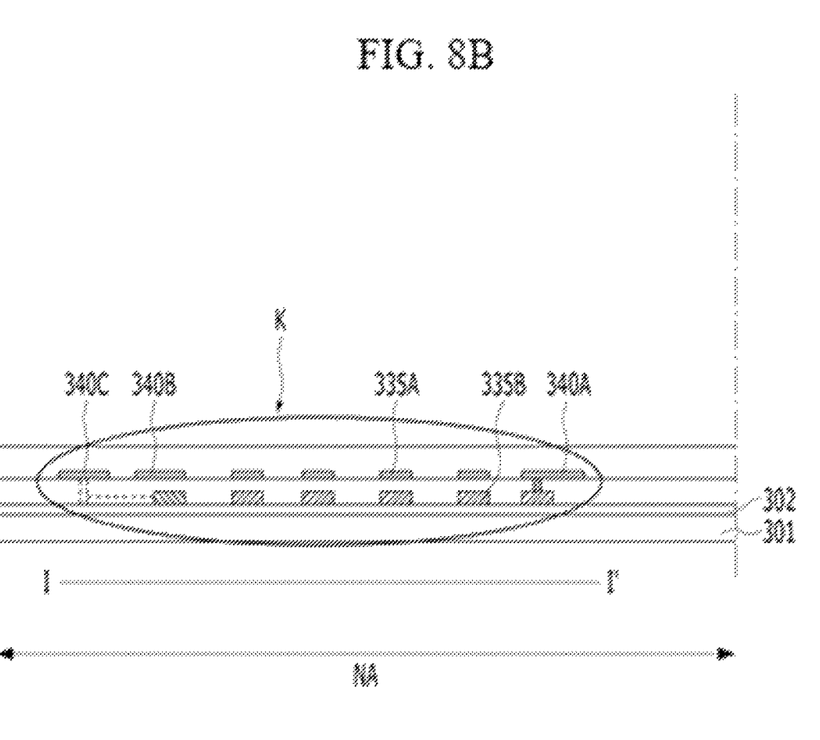
FIG. 8B is a cross-sectional view taken along line I-I' in FIG. 3, showing a structure of a thin film layer test part according to another aspect of the present disclosure.

Meanwhile, FIGS. 8A and 8B illustrates a thin film transistor TFT having a bottom gate structure in accordance with another aspect of the present disclosure.

The thin film transistor TFT, which has the bottom gate structure, may be used in a liquid crystal display device or the like. In the thin film transistor TFT having the bottom gate structure, a lower buffer layer 302 is formed on a substrate 301, and a gate electrode 306 formed on the lower buffer layer 302, a gate insulating layer 303 covering a gate electrode 306, a semiconductor pattern 304 disposed on the gate insulating layer 303, and a source electrode 309S and a drain electrode 309D electrically connected to the semiconductor pattern 304 are sequentially disposed. In addition, a thin film layer test part K is disposed in a non-display area NA.

The thin film layer test part K includes a second wiring part 335B, which may be formed on the same layer as the gate electrode 306 using the same material as the gate electrode 306, and a first wiring part 335A, which may be formed on the same layer as the source electrode 309S and the drain electrode 309D using the same material as the source electrode 309S and the drain electrode 309D. Accordingly, the second wiring part 335B may be formed by the same mask process as the gate electrode 306, and the first wiring part 335A may be formed by the same mask process as the source electrode 309S and the drain electrode 309D and, as such, the number of mask processes may be reduced.

As apparent from the above description, each display panel of the display device of the present disclosure includes a thin film layer test part and, as such, may monitor a deposition situation of a plurality of thin film layers of the panel on a substrate as to determine whether or not the plurality of thin film layers are uniformly deposited in accordance with a position thereof. Accordingly, when a failure of the display panel caused by a thin film layer occurs, it may be possible to easily find the thin film layer causing the failure of the display panel. In addition, as the thin film layer causing the failure of the display panel is found, it may be possible to identify a procedure of deposition equipment associated with the thin film layer and, as such, to rapidly take measures to address a cause of the failure.

The present disclosure is applicable to various display devices, such as a liquid crystal display device, an organic light emitting display device, a plasma display device, etc., in which a plurality of thin film layers, for example, inorganic insulating layers and organic insulating layers, are stacked to constitute an array substrate and, as such, may achieve efficient failure repair through application thereof to a manufacturing process of a display device involving a deposition process.

The foregoing descriptions and the accompanying drawings have been presented in order to illustratively explain technical ideas of the present disclosure. A person skilled in the art to which the present disclosure pertains can appreciate that diverse modifications and variations by combining, dividing, substituting for, or changing constituent elements may be possible without changing essential characteristics of the present disclosure. Therefore, the foregoing aspects disclosed herein shall be interpreted as illustrative only and not as limitative of the principle and scope of the present disclosure. It should be understood that the scope of the present disclosure shall be defined by the appended claims and all of their equivalents fall within the scope of the present disclosure.

What is claimed is:

1. A display device comprising:
a display panel formed on a substrate and comprising a display area where a plurality of thin film layers is formed, and a non-display area where the plurality of thin film layers is formed and disposed around the display area; and
a thin film layer test part disposed in the non-display area, wherein the thin film layer test part comprises:
a first wiring part disposed on an upper surface of at least one thin film layer of the plurality of thin film layers,
a second wiring part disposed on a lower surface of the at least one thin film layer,
a first pad part connected to a first node where one end of the first wiring part and one end of the second wiring part meet;
a second pad part connected to another end of the first wiring part, and
a third pad part connected to another end of the second wiring part,
wherein each of the first wiring part and the second wiring part comprises a plurality of first portions extending in a direction of a tensile stress or compressive stress applied to the at least one thin film layer, and a plurality of second portions each interconnecting ends of adjacent ones of the plurality of first portions.

2. The display device according to claim 1, wherein the first pad part, the second pad part, and the third pad part are disposed on the upper surface of the at least one thin film layer.

3. The display device according to claim 2, wherein the first pad part is connected to the second wiring part via a first contact hole extending through the at least one thin film layer, and the third pad part is connected to the second wiring part via a second contact hole extending through the at least one thin film layer.

4. The display device according to claim 1, wherein each of the first wiring part and the second wiring part has a meandering structure.

5. The display device according to claim 1, wherein each of the first wiring part and the second wiring part is varied in resistance in accordance with a tensile force or a compressive force exerted on the at least one thin film layer.

6. The display device according to claim 1, further comprising:
a thin film transistor in the display area comprising a semiconductor pattern formed on the substrate, a gate electrode overlapping with the semiconductor pattern, and a source electrode and a drain electrode disposed on the semiconductor pattern and electrically connected to the semiconductor pattern; and
a storage capacitor in the display area comprising a first capacitor electrode, and a second capacitor electrode overlapping with the first capacitor electrode with an interlayer insulating layer interposed therebetween.

7. The display device according to claim 6, wherein the first wiring part is disposed on a same layer as one of the first capacitor electrode and the second capacitor electrode; and
wherein the second wiring part is disposed on a same layer as the gate electrode.

8. The display device according to claim 6, wherein the first wiring part is disposed on a same layer as one of the source electrode and the drain electrode; and
wherein the second wiring part is disposed on a same layer as one of the first capacitor electrode and the second capacitor electrode.

9. The display device according to claim 6, wherein the first wiring part is disposed on a same layer as one of the source electrode and the drain electrode; and
wherein the second wiring part is disposed on a same layer as the gate electrode.

10. The display device according to claim 1, wherein the at least one thin film layer comprises an inorganic insulating layer.

11. The display device according to claim 1, wherein each of the plurality of first portions is greater in length than each of plurality of the second portions.

* * * * *